United States Patent
Liu et al.

(10) Patent No.: US 12,261,607 B2
(45) Date of Patent: Mar. 25, 2025

(54) MULTI-PATH VOLTAGE-CONTROLLED OSCILLATOR WITH SAME VARACTOR CONTROLLED BY INPUTS FROM DIFFERENT PATHS AND ASSOCIATED METHOD

(71) Applicant: MEDIATEK INC., Hsin-Chu (TW)

(72) Inventors: Tsz-Bin Liu, Hsinchu (TW); Mohammed Mohsen Abdulsalam Abdullatif, San Jose, CA (US); Ahmed Safwat Mohamed Aboelenein Elmallah, San Jose, CA (US); Mohammed Tamer Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 26 days.

(21) Appl. No.: 18/203,671

(22) Filed: May 31, 2023

(65) Prior Publication Data

US 2023/0403015 A1    Dec. 14, 2023

Related U.S. Application Data

(60) Provisional application No. 63/351,915, filed on Jun. 14, 2022.

(51) Int. Cl.
*H03L 7/099* (2006.01)
*H03B 5/12* (2006.01)
*H03L 7/08* (2006.01)

(52) U.S. Cl.
CPC ............. *H03L 7/099* (2013.01); *H03B 5/124* (2013.01); *H03L 7/0807* (2013.01); *H03B 2200/0042* (2013.01)

(58) Field of Classification Search
CPC ....... H03L 7/099; H03L 7/0807; H03L 7/093; H03B 5/124

See application file for complete search history.

(56) References Cited

U.S. PATENT DOCUMENTS 8,125,254 B1   2/2012   Ding
8,760,201 B1   6/2014   Gao
(Continued)

FOREIGN PATENT DOCUMENTS

WO   2009/109636 A2   9/2009
WO   2009/109636 A3   11/2009
WO   2009/109636 A4   2/2010

OTHER PUBLICATIONS

Zhichao Zhang et al., Single-Event Effects Characterization of LC-VCO PLLs in a 28-nm CMOS Technology, IEEE Transactions on Nuclear Science, Sep. 2020, pp. 2042-2050, vol. 67, No. 9, IEEE, XP011808864, Sep. 2020.

(Continued)

*Primary Examiner* — Jeffrey M Shin
(74) *Attorney, Agent, or Firm* — Winston Hsu

(57) ABSTRACT

A multi-path voltage-controlled oscillator (VCO) includes a VCO core circuit and a control voltage generator circuit. The VCO core circuit includes a varactor that has a control node for receiving a control voltage. The control voltage generator circuit receives at least one proportional path (P-path) control input and an integral path (I-path) control input, and generates and outputs the control voltage to the control node of the varactor according to the at least one P-path control input and the I-path control input.

19 Claims, 5 Drawing Sheets

(56) References Cited

U.S. PATENT DOCUMENTS

| 9,831,880 B1* | 11/2017 | Kuan | H03L 7/093 |
| 2019/0158022 A1 | 5/2019 | Issakov | |
| 2019/0165796 A1 | 5/2019 | Ferriss | |

OTHER PUBLICATIONS

Yongsun Lee et al., A Low-Jitter and Low-Reference-Spur Ring-VCO-Based Switched-Loop Filter PLL Using a Fast Phase-Error Correction Technique, IEEE Journal of Solid-State Circuits, Apr. 2018, pp. 1192-1202, vol. 53, No. 4, IEEE, XP011679959, Apr. 2018.

Mark Ferriss et al. "An Integral Path Self-Calibration Scheme for a Dual-Loop PLL" IEEE Journal of Solid-State Circuits, vol. 48, No. 4, Apr. 30, 2013, https://www.researchgate.net/publication/260627242_An_Integral_Path_Self-Calibration_Scheme_for_a_Dual-Loop_PLL, pp. 996-1008. ,Apr. 30, 2013.

* cited by examiner

MULTI-PATH VOLTAGE-CONTROLLED OSCILLATOR WITH SAME VARACTOR CONTROLLED BY INPUTS FROM DIFFERENT PATHS AND ASSOCIATED METHOD

CROSS REFERENCE TO RELATED APPLICATIONS

This application claims the benefit of U.S. Provisional Application No. 63/351,915, filed on Jun. 14, 2022. The content of the application is incorporated herein by reference.

BACKGROUND

The present invention relates to a voltage-controlled oscillator design, and more particularly, to a multi-path voltage-controlled oscillator with a same varactor that is controlled by inputs from different paths (which may include an integral path and one or more proportional paths) and an associated method.

Some data transmission applications may require phase-locked loops (PLLs) with well controlled bandwidth and frequency. To allow flexibility in the setting of these two loop parameters, dual-path PLLs have been proposed to include a proportional path (P-path) responsible for bandwidth control and an integral path (I-path) responsible for frequency control. A VCO used in a PLL may be implemented by an inductor-capacitor (LC) VCO. It is possible that one PLL is located in the proximity of another PLL in the same chip due to certain circuit design considerations. Thus, an LC VCO included in one PLL may be interfered with electromagnetic (EM) coupling from an LC VCO included in another PLL. In general, a dual-path PLL with a large I-path gain Ki results in better EM suppression, but suffers a PLL loop stability issue. Hence, it is needed to control a proper and stable ratio of the P-path gain Kp to the I-path gain Ki (i.e., Kp/Ki) over PVT (process, voltage, temperature) variation when using a large I-path gain Ki. A conventional dual-path VCO design employs separate varactors for I-path and P-path. However, size disparity of two varactors causes bad matching. In addition, it is hard to make them track the same direct-current (DC) bias under PVT variation. Thus, there is a need for an innovative VCO design that can address above issues.

SUMMARY

One of the objectives of the claimed invention is to provide a multi-path voltage-controlled oscillator with a same varactor that is controlled by inputs from different paths (which may include an integral path and one or more proportional paths) and an associated method.

According to a first aspect of the present invention, an exemplary multi-path voltage-controlled oscillator (VCO) is disclosed. The multi-path VCO includes a VCO core circuit and a control voltage generator circuit. The VCO core circuit includes a varactor that has a control node for receiving a control voltage. The control voltage generator circuit is arranged to receive at least one proportional path (P-path) control input and an integral path (I-path) control input, and generate and output the control voltage to the control node of the varactor according to said at least one P-path control input and the I-path control input.

According to a second aspect of the present invention, an exemplary method for setting a control voltage at a control node of a varactor included in a multi-path voltage-controlled oscillator (VCO) is disclosed. The exemplary method includes: receiving at least one proportional path (P-path) control input; receiving an integral path (I-path) control input; and generating and outputting the control voltage to the control node of the varactor according to said at least one P-path control input and the I-path control input.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
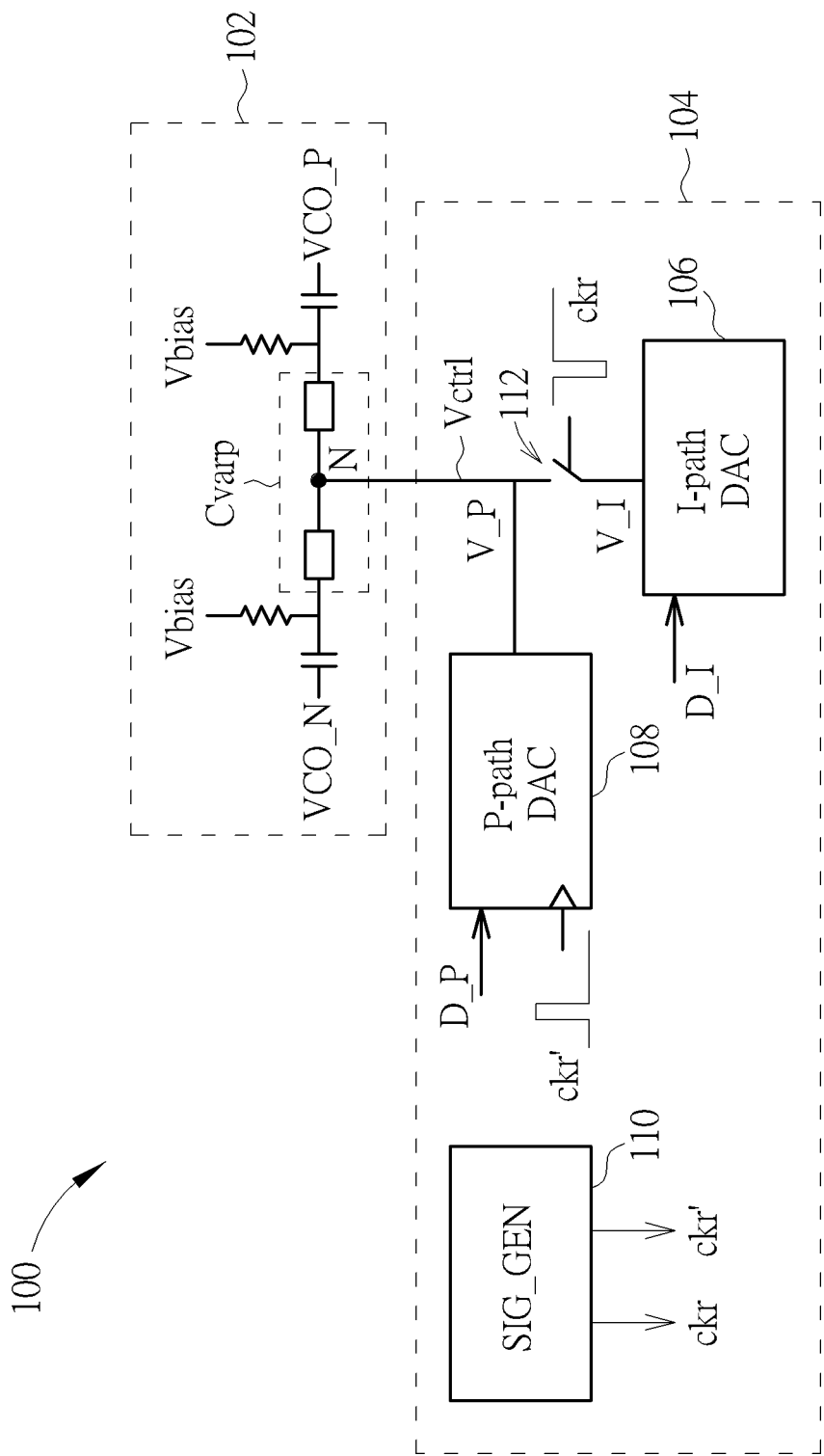
FIG. 1 is a diagram illustrating a first multi-path VCO design according to an embodiment of the present invention.

FIG. 1 is a diagram illustrating a first multi-path voltage-controlled oscillator (VCO) design according to an embodiment of the present invention. In this embodiment, the multi-path VCO 100 may be employed by an all-digital phase-locked loop (ADPLL) circuit. However, this is for illustrative purposes only, and is not meant to be a limitation of the present invention. In practice, any application using the proposed multi-path VCO 100 falls within the scope of the present invention. The multi-path VCO 100 includes a VCO core circuit 102 and a control voltage generator circuit 104. The VCO core circuit 102 may be implemented by an inductor-capacitor (LC) VCO, including a varactor Cvarp that has a control node N for receiving a control voltage Vctrl. The varactor Cvarp is coupled between output nodes VCO P and VCO N of the LC VCO, and is biased by a DC bias voltage Vbias. It should be noted that only the components pertinent to the present invention are illustrated in FIG. 1. In practice, the VCO core circuit 102 further includes other components (e.g., inductor, capacitor bank, and transistors) to achieve its designated function.

The control voltage generator circuit 104 is arranged to receive a proportional path (P-path) control input D_P and an integral path (I-path) control input D_I, and generate and output the control voltage Vctrl to the control node N of the varactor Cvarp according to the P-path control input D_P and the I-path control input D_I. In this embodiment, each of the P-path control input D_P and the I-path control input D_I may be a digital signal. As shown in FIG. 1, the control voltage generator circuit 104 includes an I-path digital-to-analog converter (DAC) 106, a P-path DAC 108, a signal generator circuit (labeled by "SIG_GEN") 110, and a switch circuit 112.

The I-path DAC 106 is arranged to convert the I-path control input D_I (which is a DAC input of I-path) into an I-path control voltage V_I. The P-path DAC 108 is arranged to convert the P-path control input D_P (which is a DAC input of P-path) into a P-path control voltage V_P. The P-path DAC 108 may be implemented using a capacitor DAC (C-DAC) or a resistor DAC (R-DAC), depending upon actual design considerations. The I-path DAC 106 may be implemented using a C-DAC or an R-DAC, depending upon actual design considerations. To put is simply, the present invention has no limitations on DAC structures of the P-path DAC 108 and the I-path DAC 106 employed by the control voltage generator circuit 104.

In this embodiment, the P-path control voltage V_P and the I-path control voltage V_I are both involved in setting the control voltage Vctrl at the control node N of the varactor Cvarp. In other words, the same varactor Cvarp is shared among I-path and P-path. To achieve the objective of sharing the same varactor Cvarp among I-path and P-path, the control voltage Vctrl is set through time-division multiplexing of the P-path control voltage V_P and the I-path control voltage V_I. Specifically, the signal generator circuit 110 is arranged to manage time-division multiplexing of the P-path control voltage V_P and the I-path control voltage V_I. In this embodiment, the P-path DAC 108 may be implemented using a C-DAC, and the I-path DAC 106 may be implemented using an R-DAC. Hence, a switch circuit 112 is coupled between the I-path DAC (which is an R-DAC) 106 and the control node N of the varactor Cvarp. Due to inherent characteristics of the C-DAC, there is no need to have a switch circuit coupled between the P-path DAC (which is a C-DAC) 108 and the control node N of the varactor Cvarp. However, the present invention does not exclude an alternative design having an additional switch circuit between the P-path DAC (which is a C-DAC) 108 and the control node N of the varactor Cvarp. The signal generator circuit 110 generates a clock signal ckr' with short pulses (i.e., short off-periods) to control enabling of the P-path DAC 108, and generates a clock signal ckr with long pulses (i.e., long on-periods) to control an on/off status of the switch circuit 112.

Figure 2:
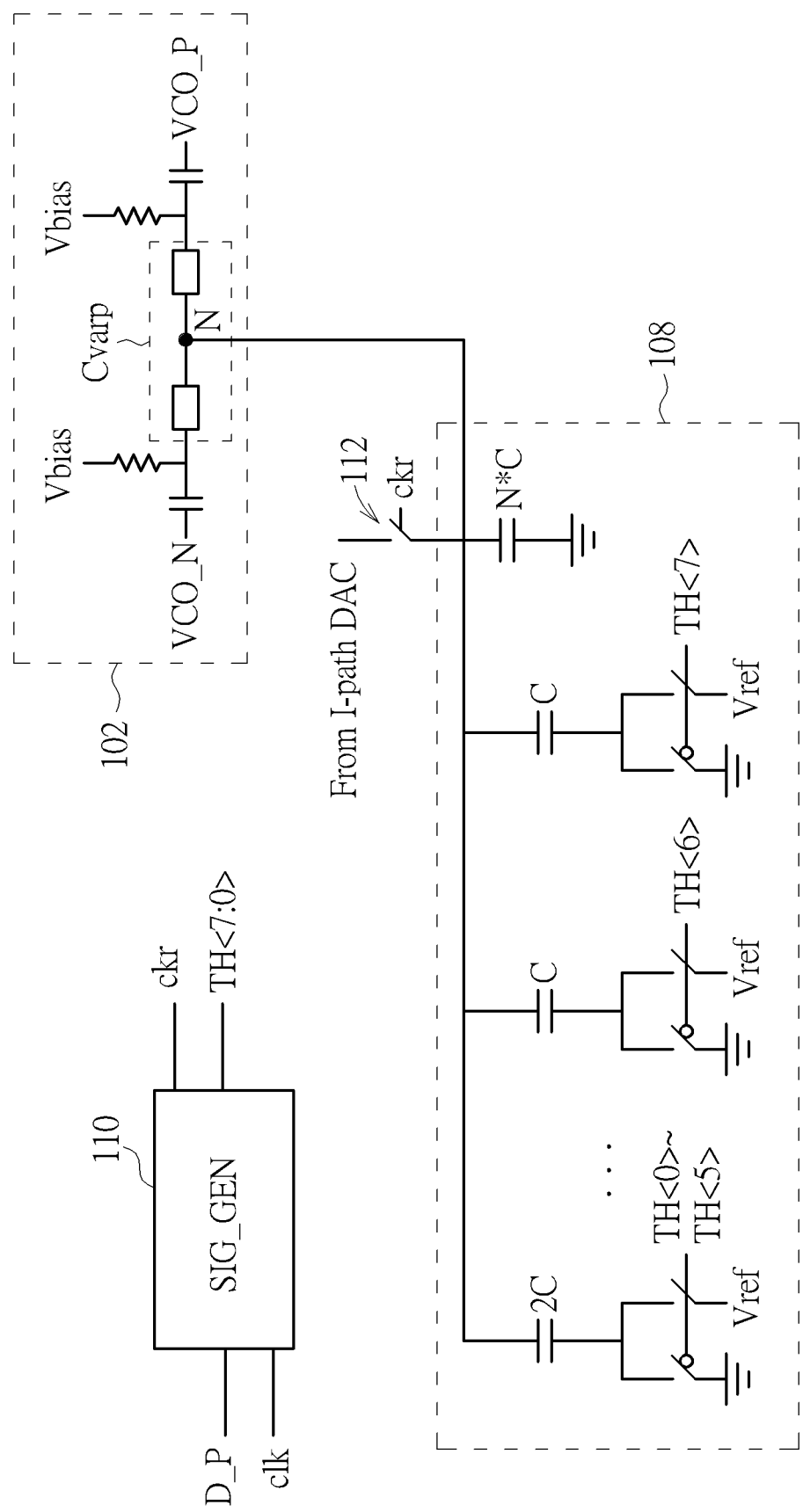
FIG. 2 is a diagram illustrating a circuit diagram of a P-path DAC shown in FIG. 1 according to an embodiment of the present invention.
Figure 3:
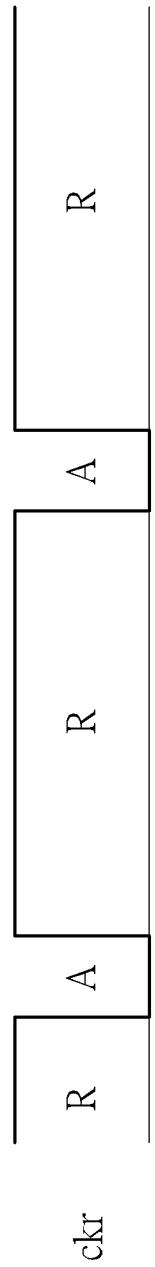
FIG. 3 is a diagram illustrating a waveform of a clock signal generated from a signal generator circuit shown in FIG. 1.

Please refer to FIG. 2 in conjunction with FIG. 3. FIG. 2 is a diagram illustrating a circuit diagram of the P-path DAC 108 shown in FIG. 1 according to an embodiment of the present invention. FIG. 3 is a diagram illustrating a waveform of the clock signal ckr generated from the signal generator circuit 110 shown in FIG. 1. Since the P-path DAC 108 is implemented using a C-DAC (which occupies a small chip area and operates at high speed without buffering), the signal generator circuit 110 further generates switch control signals TH<7:0> according to the P-path control input D_P and a reference clock signal clk. In this embodiment, the clock signal ckr' received by the P-path DAC (which is a C-DAC) 108 may be an inverse version of the clock signal ckr, that is, ckr'=$\overline{ckr}$. Hence, during each period A (i.e., each off-period of clock signal ckr), the switch circuit 112 is switched off for blocking the I-path control voltage V_I from being delivered to the control node N of the varactor Cvarp, and the P-path DAC 108 is active for driving the control node N of the varactor Cvarp by the P-path control voltage V_P. During each period R (i.e., each on-period of clock signal ckr), the switch circuit 112 is switched on for allowing the I-path DAC 106 to drive the control node N of the varactor Cvarp by the I-path control voltage V_I, and the P-path DAC 108 is reset. With proper settings of the clock signals ckr and ckr', the control voltage Vctrl is set through time-division multiplexing of the P-path control voltage V_P and the I-path control voltage V_I. In other words, the control voltage Vctrl is jointly controlled by the P-path control voltage V_P and the I-path control voltage V_I in a time-division multiplexing manner.

It should be noted that the structure of the control voltage generator circuit 104 shown in FIG. 1 is for illustrative purposes, and is not meant to be a limitation of the present invention. For example, the number of switch circuits employed by the control voltage generator circuit 104 may depend on DAC structures of P-path DAC 108 and I-path DAC 106. In a first alternative design with P-path DAC 108 and I-path DAC 106 both implemented by C-DACs, the switch circuit 112 shown in FIG. 1 may be omitted. In a second alternative design with P-path DAC 108 and I-path DAC 106 both implemented by R-DACs, an additional switch circuit may be added between the P-path DAC 108 and the control node N of the varactor Cvarp. In a third alternative design with P-path DAC 108 implemented by R-DAC and I-path DAC 106 implemented by C-DAC, an additional switch circuit may be added between the P-path DAC 108 and the control node N of the varactor Cvarp, and the switch circuit 112 shown in FIG. 1 may be omitted.

The multi-path VCO 100 shown in FIG. 1 is a dual-path VCO that operates in response to one P-path control input D_P and one I-path control input D_I. However, this is for illustrative purposes only, and is not meant to a limitation of the present invention. In an alternative design, the proposed multi-path VCO may operate in response to multiple P-path control inputs and one I-path control input.

Figure 4:
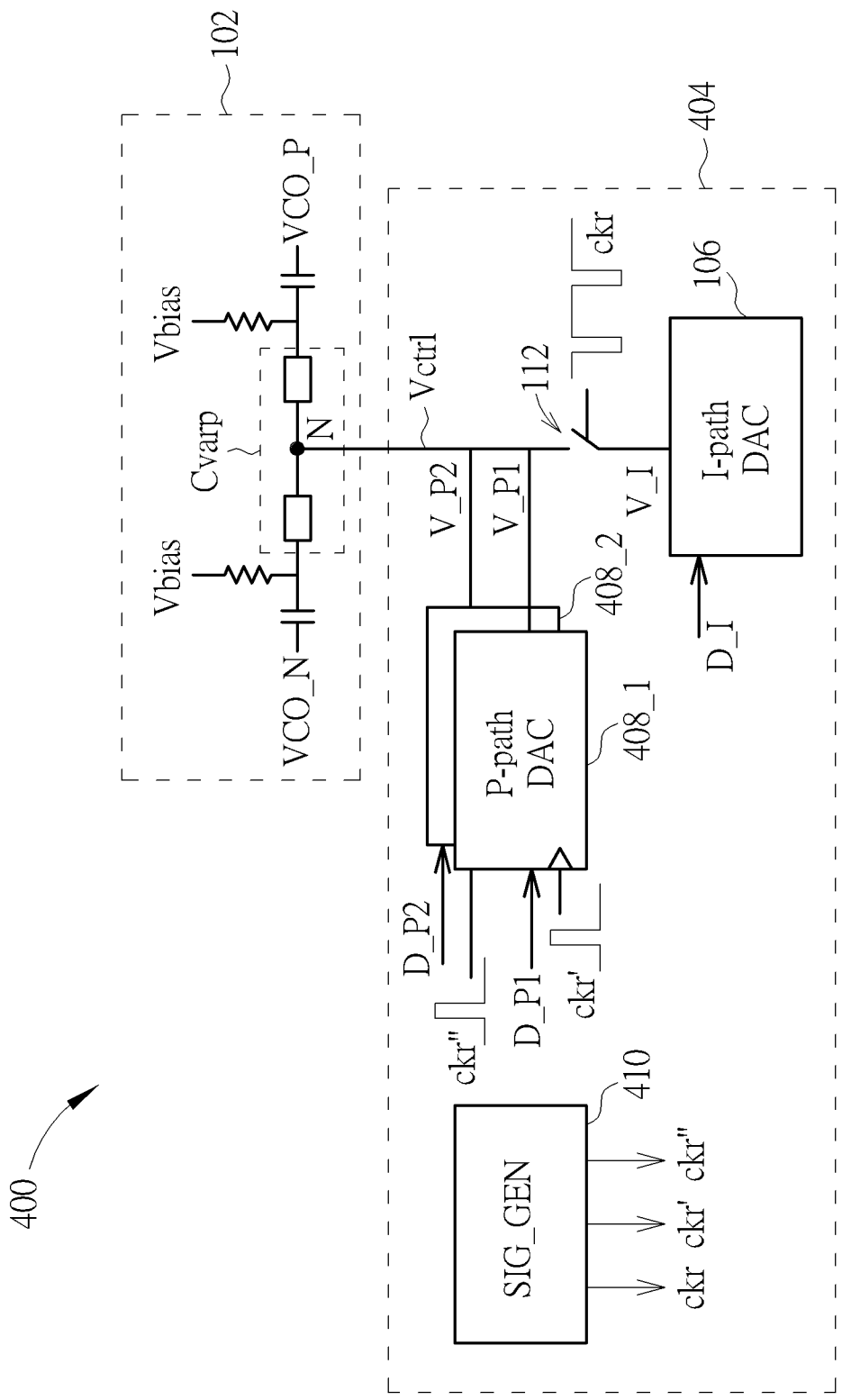
FIG. 4 is a diagram illustrating a second multi-path VCO design according to an embodiment of the present invention.

FIG. 4 is a diagram illustrating a second multi-path VCO design according to an embodiment of the present invention. In this embodiment, the multi-path VCO 400 may be employed by an ADPLL circuit. However, this is for illustrative purposes only, and is not meant to be a limitation of the present invention. In practice, any application using the proposed multi-path VCO 400 falls within the scope of the present invention. The major difference between the multi-path VCOs 100 and 400 is that the control voltage generator circuit 404 has multiple P-path DACs 408_1 and 408_2. The control voltage generator circuit 404 is arranged to receive multiple P-path control inputs D_P1, D_P2 and an I-path control input D_I, and generate and output the control voltage Vctrl to the control node N of the varactor Cvarp according to the P-path control inputs D_P1, D_P2 and the I-path control input D_I. For example, one of the P-path control inputs D_P1 and D_P2 may be a PLL control input, and the other of the P-path control inputs D_P1 and D_P2 may be a clock and data recovery (CDR) control input.

The P-path DAC 408_1 is arranged to convert the P-path control input D_P1 (which is a DAC input of one P-path) into a P-path control voltage V_P1. The P-path DAC 408_2 is arranged to convert the P-path control input D_P2 (which is a DAC input of another P-path) into a P-path control voltage V_P2. The P-path DAC 408_1 may be implemented using a C-DAC or an R-DAC, depending upon actual design considerations. The P-path DAC 408_2 may be implemented using a C-DAC or an R-DAC, depending upon actual design considerations.

In this embodiment, the P-path control voltages V_P1, V_P2 and the I-path control voltage V_I are involved in setting the control voltage Vctrl at the control node N of the varactor Cvarp. In other words, the same varactor Cvarp is shared among one I-path and two P-paths. To achieve the objective of sharing the same varactor Cvarp among one I-path and two P-paths, the control voltage Vctrl is set through time-division multiplexing of the P-path control voltages V_P1, V_P2 and the I-path control voltage V_I. Like the signal generator circuit 110 shown in FIG. 1, the signal generator circuit 410 is arranged to manage time-division multiplexing of the P-path control voltages V_P1, V_P2 and the I-path control voltage V_I. In this embodiment, the P-path DACs 408_1 and 408_2 may be implemented using C-DACs, and the I-path DAC 106 may be implemented using an R-DAC. The signal generator circuit 110 generates a clock signal ckr' with short pulses (i.e., short on-periods) to control enabling of the P-path DAC 408_1, generates a clock signal ckr" with short pulses (i.e., short on-periods) to control enabling of the P-path DAC 408_2, and generates a clock signal ckr with long pulses (i.e., long on-periods) to control an on/off status of the switch circuit 112. As shown in FIG. 4, the pulse timing of the clock signal ckr' is different from the pulse timing of the clock signal ckr", and the clock signal ckr may be an XNOR result of the clock signals ckr' and ckr". Since a person skilled in the art can readily understand details of time-division multiplexing of the P-path control voltages V_P1, V_P2 and the I-path control voltage V_I after reading above paragraphs, further description is omitted here for brevity.

Figure 5:
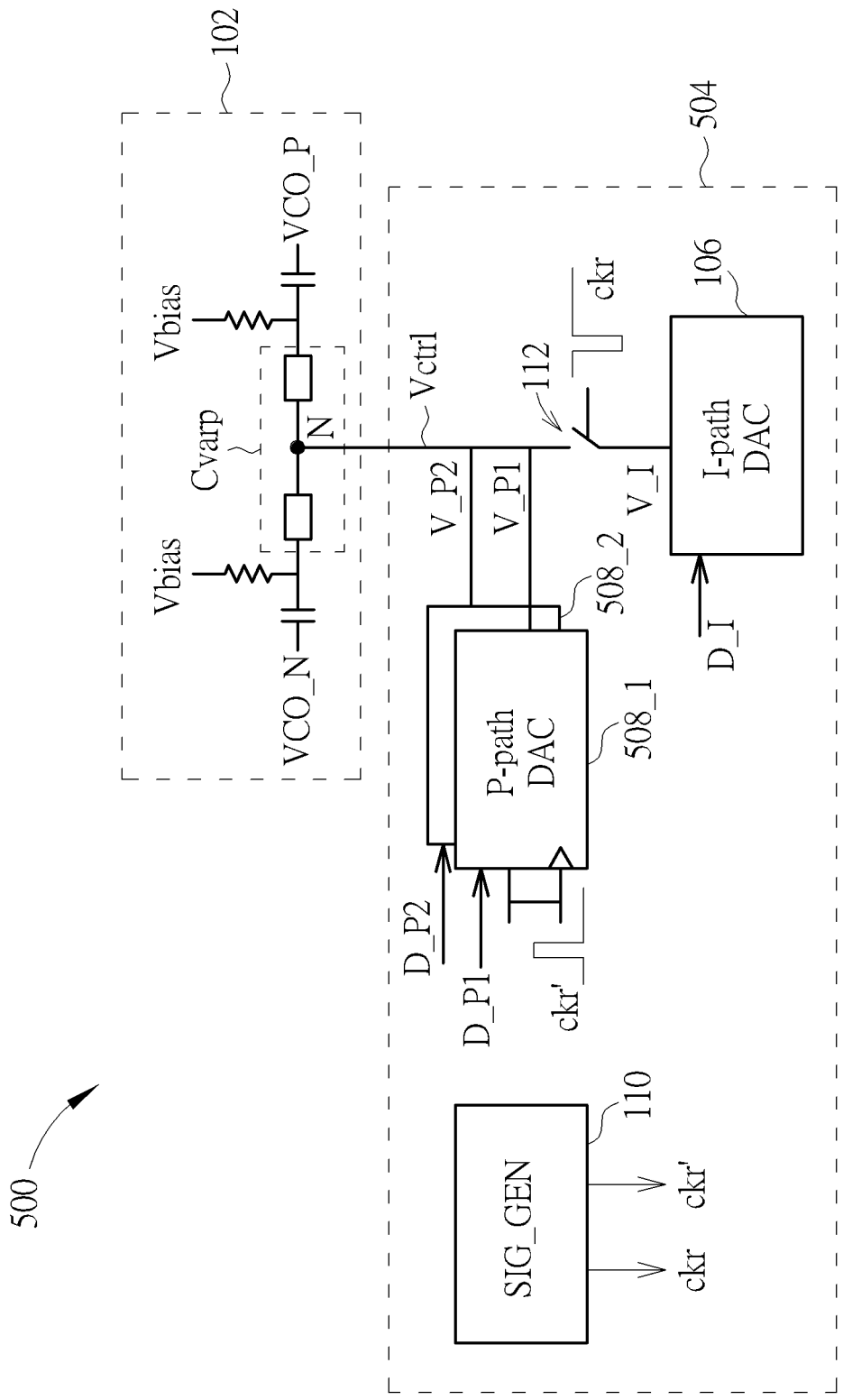
FIG. 5 is a diagram illustrating a third multi-path VCO design according to an embodiment of the present invention.

FIG. 5 is a diagram illustrating a third multi-path VCO design according to an embodiment of the present invention. In this embodiment, the multi-path VCO 500 may be employed by an ADPLL circuit. However, this is for illustrative purposes only, and is not meant to be a limitation of the present invention. In practice, any application using the proposed multi-path VCO 500 falls within the scope of the present invention. The major difference between the multi-path VCOs 400 and 500 is that multiple P-path DACs 508_1 and 508_2 of the control voltage generator circuit 504 may share the same clock signal ckr' (which may be an inverse version of clock signal ckr). Since a person skilled in the art can readily understand details of time-division multiplexing of the P-path control voltages V_P1, V_P2 and the I-path control voltage V_I after reading above paragraphs, further description is omitted here for brevity.

In summary, the proposed multi-path VCO shares the same varactor among multiple paths (which include an integral path and one or more proportional paths), and can track the same DC bias voltage and keep a stable damping factor of PLL over PVC variation for EM coupling reduction consideration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-path voltage-controlled oscillator (VCO) comprising:
   a VCO core circuit, comprising:
      a varactor, having a control node for receiving a control voltage; and
   a control voltage generator circuit, arranged to receive at least one proportional path (P-path) control input and an integral path (I-path) control input, and generate and output the control voltage to the control node of the varactor, wherein the control voltage is set through time-division multiplexing of said at least one P-path control input and the I-path control input.

2. The multi-path VCO of claim 1, wherein said at least one P-path control input comprises a phase-locked loop (PLL) control input and a clock and data recovery (CDR) control input.

3. The multi-path VCO of claim 1, wherein the control voltage generator circuit comprises:
   at least one P-path digital-to-analog converter (DAC), arranged to convert said at least one P-path control input into at least one P-path control voltage; and
   an I-path DAC, arranged to convert the I-path control input into an I-path control voltage;
   wherein the at least one P-path control voltage and the I-path control voltage are involved in setting the control voltage at the control node of the varactor.

4. The multi-path VCO of claim 3, wherein the control voltage generator circuit further comprises:
   a signal generator circuit, arranged to manage the time-division multiplexing of said at least one P-path control voltage and the I-path control voltage.

5. The multi-path VCO of claim 3, wherein each of said at least one P-path DAC is a capacitor DAC.

6. The multi-path VCO of claim 3, wherein the I-path DAC is a capacitor DAC.

7. The multi-path VCO of claim 3, wherein each of said at least one P-path DAC is a resistor DAC.

8. The multi-path VCO of claim 3, wherein the I-path DAC is a resistor DAC.

9. The multi-path VCO of claim 3, wherein the control voltage generator circuit further comprises:
   a switch circuit, coupled between said at least one P-path DAC and the control node of the varactor.

10. The multi-path VCO of claim 3, wherein the control voltage generator circuit further comprises:
    a switch circuit, coupled between the I-path DAC and the control node of the varactor.

11. A method for setting a control voltage at a control node of a varactor included in a multi-path voltage-controlled oscillator (VCO), comprising:
    receiving at least one proportional path (P-path) control input;
    receiving an integral path (I-path) control input; and
    generating and outputting the control voltage to the control node of the varactor, comprising:
       setting the control voltage through time-division multiplexing of said at least one P-path control input and the I-path control input.

12. The method of claim 11, wherein said at least one P-path control input comprises a phase-locked loop (PLL) control input and a clock and data recovery (CDR) control input.

13. The method of claim 11, wherein generating and outputting the control voltage to the control node of the varactor according to said at least one P-path control input and the I-path control input comprises:
    performing at least one P-path digital-to-analog conversion upon said at least one P-path control input to generate at least one P-path control voltage; and
    performing an I-path digital-to-analog conversion upon the I-path control input to generate an I-path control voltage;
    wherein the at least one P-path control voltage and the I-path control voltage are involved in setting the control voltage at the control node of the varactor.

14. The method of claim 13, wherein each of said at least one P-path digital-to-analog conversion is performed by using a capacitor digital-to-analog converter.

15. The method of claim 13, wherein the I-path digital-to-analog conversion is performed by using a capacitor digital-to-analog converter.

16. The method of claim 13, wherein each of said at least one P-path digital-to-analog conversion is performed by using a resistor digital-to-analog converter.

17. The method of claim 13, wherein the I-path digital-to-analog converter is performed by using a resistor DAC.

18. The method of claim 13, wherein generating and outputting the control voltage to the control node of the varactor according to said at least one P-path control input and the I-path control input further comprises:

selectively transmitting said at least one P-path control voltage to the control node of the varactor.

19. The method of claim 13, wherein generating and outputting the control voltage to the control node of the varactor according to said at least one P-path control input and the I-path control input further comprises:

selectively transmitting the I-path control voltage to the control node of the varactor.

\* \* \* \* \*